(12) United States Patent
Johnson et al.

(10) Patent No.: US 6,272,665 B1
(45) Date of Patent: Aug. 7, 2001

(54) METHOD AND TOOL FOR AUTOMATICALLY GENERATING ENGINEERING CHANGE ORDER

(75) Inventors: Lee E. Johnson, Round Rock; Thuy-Linh T. Bui, Pflugerville, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,348

(22) Filed: Apr. 29, 1999

(51) Int. Cl.$^7$ .................................................. G06F 17/50
(52) U.S. Cl. .................................................. 716/3
(58) Field of Search .................................................. 716/3

(56) References Cited

U.S. PATENT DOCUMENTS 5,956,256 * 9/1999 Rezek et al. ............................... 716/3

OTHER PUBLICATIONS

J.D. Atkins, Design Automation for Vertical Adjacency and Horizontal Direct Optimization, IBM Technical Disclosure Bulletin, Mar. 1974, vol. 16, No. 10, U.S.A.

L.G. Bulson, S.R.Hinkelman, and J.M. Korchmar, Application to Consolidate Common Electronic Card Test Fixturing Tasks, IBM Technical Disclosure Bulletin, Oct. 1993, vol. 36, No. 10, U.S.A.

A. Benayoun, A. Bussani, JF. Le Pennec, P. Michel, and C. Pin, Synthesis Optimization by Automatic Very High Design Language Style Change, IBM Technical Disclosure Bulletin, May 1997, vol. 40, No. 05, U.S.A.

* cited by examiner

Primary Examiner—Trong Phan
(74) Attorney, Agent, or Firm—Leslie A. Van Leeuwen; Strasburger & Price, LLP

(57) ABSTRACT

A tool and method that automatically formats an Engineering Change Order (ECO), in a programming language suitable for processing by an Electronic Design Automation (EDA) tool, in order to specify metal-only design changes to complex hardware data-paths through changes in the netlist. The invention comprises an initial import component that imports a working netlist which serves as the baseline on which the tool operates. The tool further comprises four components: a bus extraction component, an index creation component, a text editor, and an ECO generation component. One or more buses are extracted from the working netlist and tabulated into an index table. The user uses a test editor to modify the index table to create a modified index table that embodies the desired design change. Finally, the ECO generation component automatically reconfigures the modified index table into an ECO format in a language usable by automated physical design tools.

19 Claims, 3 Drawing Sheets

METHOD AND TOOL FOR AUTOMATICALLY GENERATING ENGINEERING CHANGE ORDER

TECHNICAL FIELD

The present invention relates to digital computing, and more particularly to a tool that automatically formats an Engineering Change Order (ECO), in a language suitable for processing by an Electronic Design Automation (EDA) tool, in order to specify metal-only or required design changes to complex hardware data-paths through changes in the netlist.

A portion of the disclosure of this patent document contains material that is subject to copyright protection. The copyright owner has no objection to the facsimile reproduction by anyone of the patent document or the patent disclosure, as the material appears in the Patent and Trademark Office patent file or records, but otherwise reserves all copyright rights whatsoever.

BACKGROUND OF THE INVENTION

Many microchip designs are crafted in similar processes. At the beginning stage of a typical design process, or "front end", a logic designer uses a Very High Speed Integrated Circuits (VHSIC) Design Language (VHDL) to generate a behavioral description of the chip or chip element. This behavioral description is abstracted to a fairly high level, such as the bus level, and lower-level constructs, such as pins and individual nets, are not present in the front end behavioral description.

The VHDL behavioral model then proceeds through a behavioral synthesizer to create a Register Transfer Language ("RTL") VIM (VLSI Integrated Model) netlist. This netlist is less abstract that the VHDL behavioral description, and represents, rather than buses, the individual wires connecting logic boxes. The VHDL behavioral description also goes through a logical synthesis, which creates a physical design ("PD") VIM netlist that is forwarded to the physical designer. The physical designer is involved in the "back end" of the design process, where low-level design decisions are made.

The physical designer typically runs the PD VIM netlist through physical design tools, which places and routes the ultimate, low-level physical components of the chip, such as pins 1 and wires. The design is ultimately sent to a foundry, where the masks for chip processing are finalized. Any changes to the physical chip layout are described in an Engineering Change Order (ECO).

Unfortunately, design flaws often come to light late in the logic verification, physical design, or manufacturing process. Traditionally, there has been no efficient manner of making changes to the chip design once the layout of the thousands of wires has been created at the back end of the chip design process. As stated above, an ECO must be generated in order to make a change to the PD VIM. What is desired is a manner of automatically formatting ECO language, suitable for processing by an Electronic Design Automation (EDA) tool in order to specify metal-only design changes to complex hardware data-paths through changes in the netlist. Such automatic formatting of an ECO would ensure that the source VHDL language does not need resynthesizing in order to change the design. Dispensing with the need to resynthesize VHDL in order to implement design changes allows the designers to avoid the expensive and time consuming prospect of repeating the entire engineering design cycle. As an alternative to resynthesis, the prior art requires the logic designer to identify which of the thousands of wires and pins must be re-routed and re-placed. This process is not only tedious, and time-consuming, but is also error-prone. The present invention eliminates the need to perform either of these prior art methods for implementing relatively late design changes.

SUMMARY OF THE INVENTION

The present invention is a tool and method that automatically formats an Engineering Change Order (ECO) in a language that is suitable for processing by an Electronic Design Automation (EDA) tool, in order to specify metal-only or required design changes to complex hardware data-paths through changes in the netlist. The invention comprises an initial import component that imports a working netlist which serves as the baseline on which the tool operates. The tool further comprises four components: a bus extraction component, an index creation component, a text editor, and an ECO generation component. The bus extraction component extracts one or more buses from the working netlist. The buses to be extracted are specified by the user, usually a logic designer. The tool tabulates these extracted buses into an index table through the operation of its index creation component. The third component, the text editor, is used by the user to modify the index table to create a modified index table that embodies the desired design change. Finally, the ECO generation component automatically reconfigures the modified index table into an ECO, in a format that automated physical design tools may easily read and process.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE PREFERRED EMBODIMENT

The present invention comprises a method and tool that automatically formats an Engineering Change Order in a language that is suitable for processing by an EDA tool. This disclosure describes numerous specific details that include specific design methodologies, code statements, and logic functions in order to provide a thorough understanding of the present invention. One skilled in the art will appreciate that one may practice the present invention without these specific details.

Figure 1:
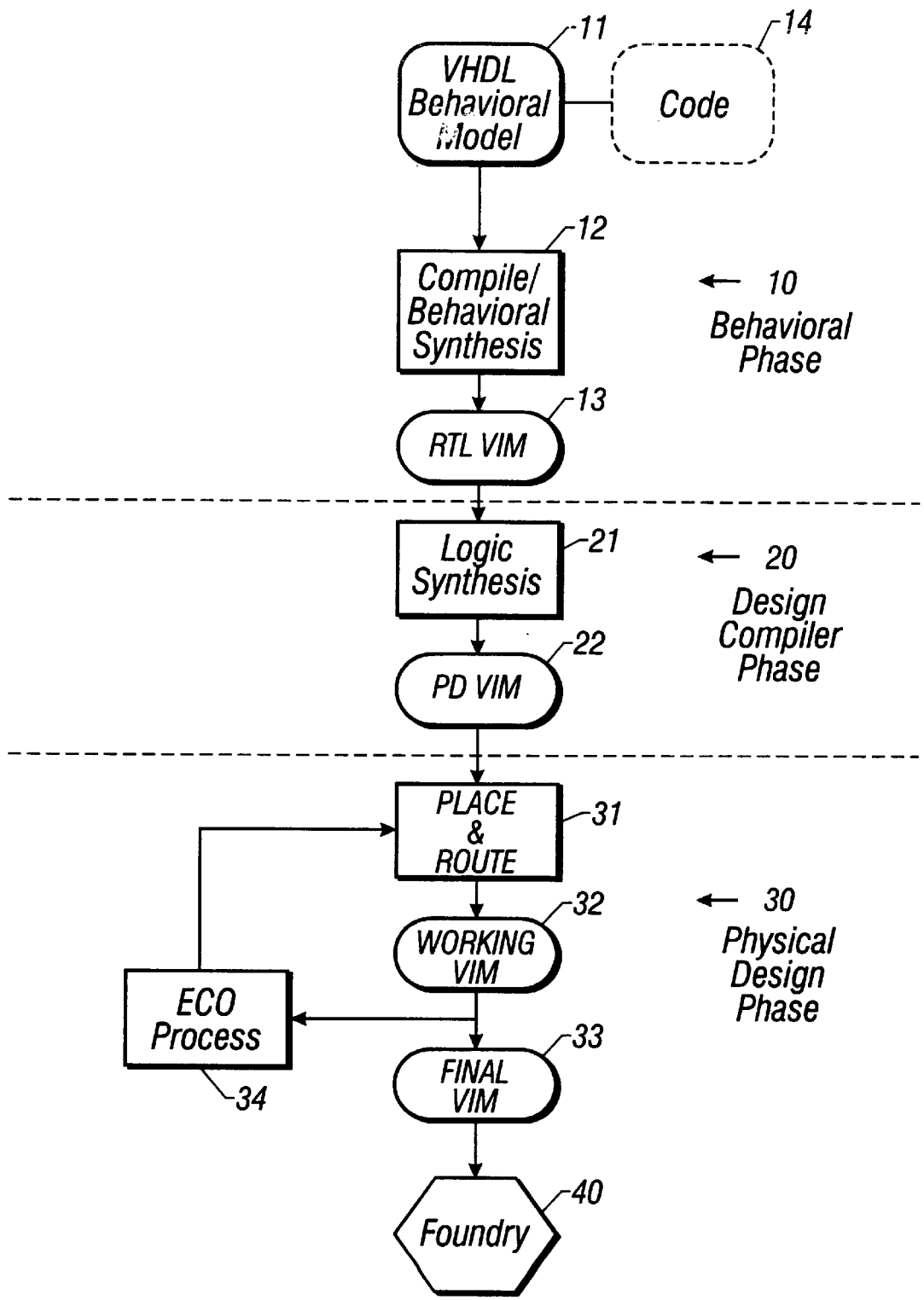
FIG. 1 is a block diagram illustrating the typical prior art design engineering process.

FIG. 1 illustrates the typical prior art design engineering process, which is aided by EDA tools. FIG. 1 illustrates that, in the first phase of design, the Behavioral Phase 10, a behavioral model 11 of the chip or component is created. The behavioral model 11 is typically generated in VHDL and is associated with some additional software code 14. The VHDL behavioral model 11 is usually modeled at a high level that only describes data flow in terms of buses, rather than wires between logic boxes. In the second step 12 of the Behavioral Phase 10, the behavioral model 11 is compiled in a behavioral synthesis step 12. This behavioral synthesis step 12 generates an RTL VIM 13 that is passed to the second design phase, the Design Compiler Phase 20. The RTL VIM 13 is a lower-level representation of the chip or component. Rather than a higher-level representation at the bus level, the RTL VIM 13 represents the gates and wires associated with the desired logic design.

FIG. 1 illustrates that the Design Compiler Phase 20 is where the RTL VIM 13 undergoes a logic synthesis step 21 to produce a PD VIM 22. The PD VIM 22 is passed to the Physical Design Phase 30.

The PD VIM 22 is the netlist describing the design that is delivered to the physical design team for the Physical Design phase 30. In the Physical Design Phase 30, the physical design team performs "place and route" to determine the exact physical layout of the pins and wires necessary to implement the design. The result of the Place and Route step 31 is a working VIM 32 that describes the mask of the chip to be generated by the foundry 40.

When changes are to be implemented to the design during the Physical Design Phase 30, the change must be indicated to the physical design team via an Engineering Change Order (ECO). The ECO is generated by the logic designer. The ECO is then implemented by the physical design team, which must re-run the Place and Route step 31 to determine the exact placement of pins and wires to implement the newly configured design. After the ECO process 34 has been iterated one or more times to implement the design changes desired by the logic designer, a final VIM 33 is created. The final VIM 33 is the netlist that is forwarded to the foundry 40.

Figure 2:
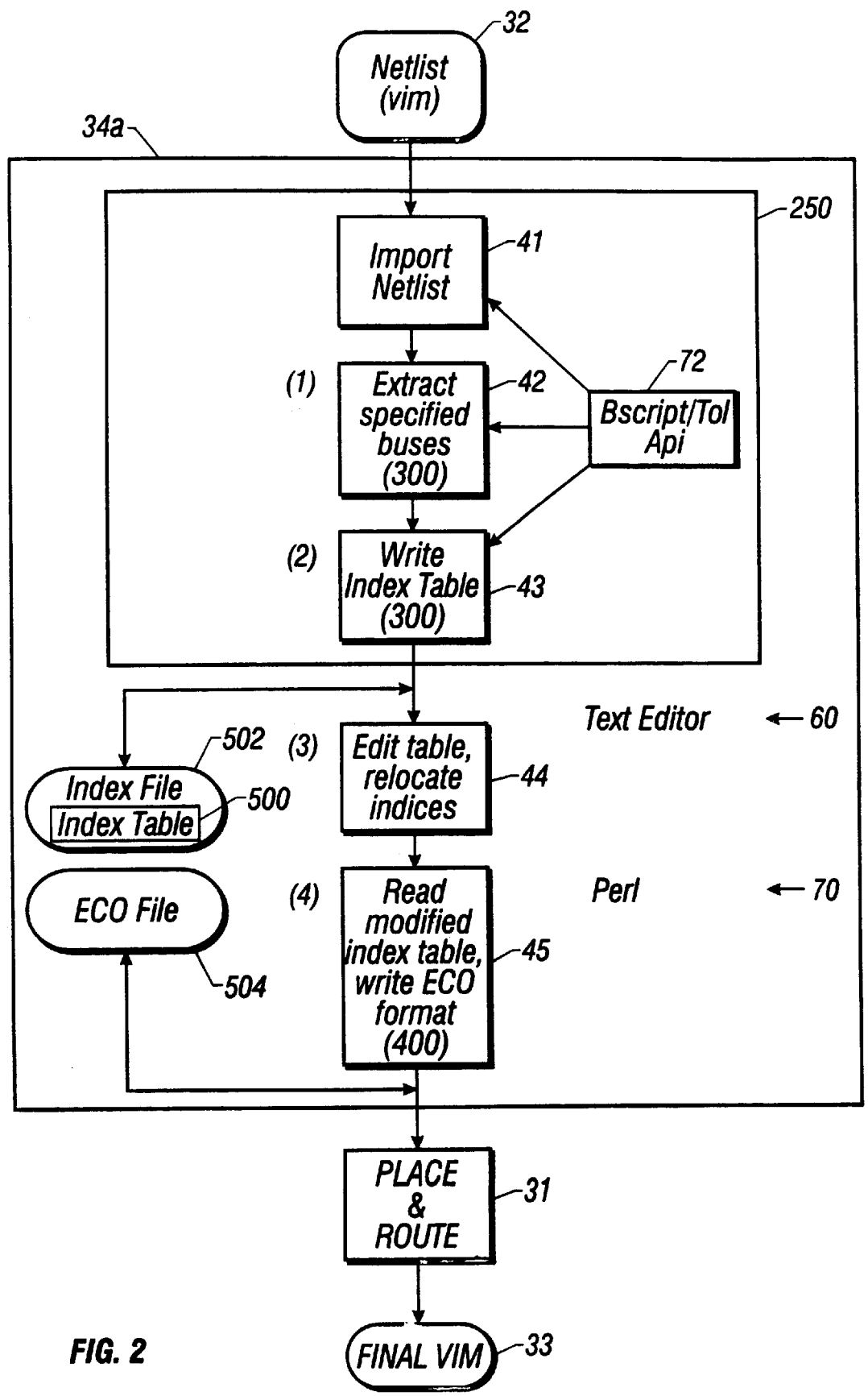
FIG. 2 is a block diagram illustrating the ECO generation tool of the present invention.

FIG. 2 illustrates the ECO tool 34a of the present invention. This tool automates and simplifies the ECO process 34 illustrated in FIG. 1. FIG. 2 illustrates that the present invention's ECO tool 34a comprises four components 42–45. As an initial matter, FIG. 2 illustrates that the ECO tool 34a of the present invention accepts as an input the working VIM 32, or in another words, the present invention imports 41 the netlist 32 for subsequent processing. This netlist 32 is the baseline on which the four components 42–45 of the present invention operate. FIG. 2 illustrates that the first two components together comprise a first automated portion 250. FIG. 2 illustrates that the third component comprises a text editor portion 60. The fourth component is illustrated in FIG. 2 as a second automated portion 70. Each of the four components 42–45 are discussed in further detail below.

FIG. 2 illustrates that the first component 42 of the present invention's ECO tool 34a is a bus extraction component 42. The bus extraction component 42 extracts for the logic designer specified buses from the netlist 32. The present invention provides an automated methodology for doing this bus extraction. The automated methodology will be discussed below in connection with the description of Appendix A. The purpose of the bus extraction component 42 is to help the logic designer identify, with the help of the automated methodology discussed below, to determine which of the low-level nets must be modified in order to implement the desired logic modification. In the prior art, this process is very time-consuming and error-prone, as the logic designer must manually inspect the netlist and identify each net that must be changed. In the present invention, the logic designer need only identify the high-level buses that are involved in the design modification, rather than identifying multiple low-level nets.

Appendix A illustrates an example of the preferred embodiment of the present invention's automated methodology for the bus extraction component 42. (It should be noted that, in order not to obscure the present invention, Appendix A deliberately does not include utility functions for sorting, checking gaps, etc.) The bus extraction component 42 may be implemented using any appropriate programming language 72. Appendix A illustrates that the preferred embodiment of the bus extraction component 42 is implemented using Bscript, although any appropriate language may be used. Additionally, Appendix A illustrates that, in the preferred embodiment, the bus extraction component 42 comprises a Bscript function labeled in Appendix A as list_sources_sinks (hereinafter referred to as the "query program") 300. And Appendix A shows that the query program 300 queries the netlist 32 for device attachments. The logic designer provides parameters to the query program 300 to indicate a search string indicating the bus to be extracted as well as the range of signals in order to extract a subset of the signals in the entire bus. Appendix A illustrates that the query program 300 allows the logic designer to specify specific patterns that should be utilized in the extraction, without requiring her to identify the precise nets to be modified. This is a distinct advantage over the prior art.

Referring back to FIG. 2, we are now ready to discuss the second component 43 of the present invention's ECO tool 34a. FIG. 2 illustrates that the second component 43 is an index creation component that writes an Index Table 500, which is part of the Index File 502. The query program 300 illustrated set forth in Appendix A implements the index creation component 43 in addition to the bus extraction component 42 discussed above. That is, the query program 300 actually implements both step 42 and step 43 of the first automated portion 250 of the present invention.

The query program 300 set forth in Appendix A utilizes the input parameters defined by the logic designer to create an Index Table 500. To create the Index Table 500, the query program 300 formats and writes to disk a tabular format of the low-level nets described by the logic designer's input parameters into the query program 300. This data in tabular format is the Index Table 500. The Index Table 500 represents the nets to the logic designer in a fairly high-level interface format, which is similar, in terms of the level of abstraction, to the original VHDL behavioral description 11.

FIG. 2 illustrates that the third component 44 of the present invention's ECO tool 34a involves manipulation of the Index Table 500. This index manipulation component 44 (using a text editor 60) involves the examination and modification of the Index Table 500 by the logic designer, who modifies the indices within the Index Table 500 in such a way as to indicate the desired signal re-wiring in the netlist 32. While FIG. 2 illustrates that the logic designer uses the text editor 60 to edit the Index Table 500, the third step does not involve automation in the sense that the other components 42, 43, 45 do. The logic designer manually edits the Index Table 500. Because the Index Table 500 presents to the logic designer a fairly high-level interface format that is similar to the bus-level VHDL format that the logic designer is used to working with, the logic designer may easily edit the Index Table 500 to indicate the mathematical or logical change that is desired. The designer will typically indicate changes in large objects, such as a multi-bit bus. This allows the logic designer to design a modification that affects particular bus wires, without concern for the lower-level gate behavior. For example, the original signals may have been described by the logic designer in the behavioral description 11 as a bus object of many (i.e., 32) individual bits. The designer usually handles buses as a unit, not the individual bits. In the working netlist 32, these individual bits exist as individual strands that can't be handled as a unit in existing netlist editors. This is a limitation of the prior art methods of making design changes. Because the second step 43 formats the Index Table to recover the bus nature of the strands, the original designer (or another logic designer) can once again operate on the bus as a discrete object, making changes to hundreds of strands as a combined unit. The present invention thus allows accurate, automatic correction of very complex design errors, saving time and money. Failure to correct these design errors would result in production of a defective product. Existing means for correcting design flaws at the back end of the design cycle are costly and tedious, often necessitating delay of the final release of the product to market. The present invention eliminates these obstacles.

FIG. 2 illustrates that, in contrast to the third component 44, the fourth component 45 of the present invention's ECO tool 34a, is an automated component. This automated fourth component 45 is an ECO generation component that may be written in any appropriate language. In the preferred embodiment, a Perl language script (400 in Appendix B) is used to read the modified Index Table 500 and automatically generate the ECO language needed for the physical design automation tool to perform the actual modifications to the working netlist 32. The Perl language script 400 acts as a filter that reads the file in one format, i.e., the high-level interface format of the Index Table 500, and reconfigures the Index Table into a format such as ECO file 504 that usable by an automated ECO language that is well-known in the art.

Appendix B illustrates a preferred embodiment of the ECO generation component 45 of the present invention's ECO tool 34a. Appendix B sets forth a Perl script 400 that reads and decodes the Index Table 500 that has been manually modified by the logic designer. The Perl script 400 reformats the Index Table 500 into ECO language needed for the automated EDA platform that performs the actual modification to the working netlist 32. In the preferred embodiment, ChipBench is the preferred platform used for the physical design processing. Appendix B illustrates that the Perl script 400 is written such that the designer can add additional devices, such as terminators, as well as new nets. The Perl script 400 properly formats the requests in the Index Table for ECO processing.

Figure 3:
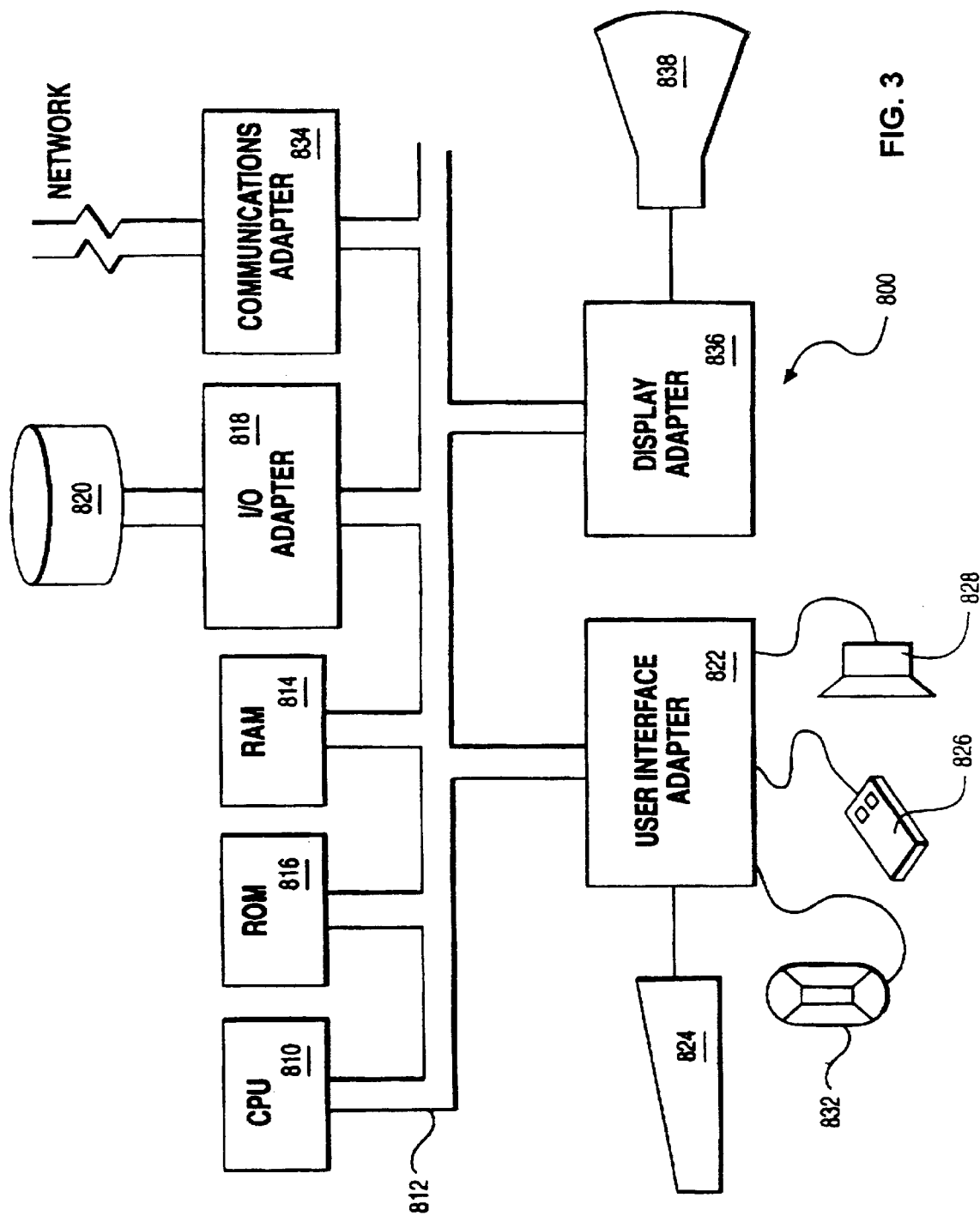
FIG. 3 illustrates a system used to practice the present invention.

FIG. 3 illustrates a data processing system 800 that could be used to practice the present invention. The system has a central processing unit (CPU) 810, such as a PowerPC™ microprocessor. The CPU 810 is coupled to various other components by system bus 812. Read only memory ("ROM") 816 is coupled to the system bus 812 and includes a basic input/output system ("BIOS") that controls certain basic functions of the data processing system 800. Random access memory ("RAM") 814, I/O adapter 818, and communications adapter 834 are also coupled to the system bus 812. I/O adapter 818 may be a small computer system interface ("SCSI") adapter that communicates with a disk storage device 820. Communications adapter 834 interconnects bus 812 with an outside network enabling the data processing system to communicate with other data processing systems or with a circuit or system under test. Input/Output devices are also connected to the system bus 812 via user interface adapter 822 and display adapter 836. Keyboard 824, track ball 832, mouse 826 and speaker 828 are all interconnected to bus 812 via user interface adapter 822. Display monitor 838 is connected to system bus 812 by display adapter 836. In this manner, a user is capable of inputting to the system through the keyboard 824, trackball 832, or mouse 826 an receiving output from the system via speaker 828 and display 838. Additionally, an operating system such as AIX™ ("AIX" is a trademark of the IBM Corporation) is used to coordinate the functions of the various components shown in FIG. 3.

Preferred implementations of the invention include implementations as a computer system programmed to execute the method or methods described herein, and as a computer program product. According to the computer system implementation, data, including sets of instructions for executing the method or methods, are resident in the RAM 814 of one or more computer systems configured generally as described above. Until required by a computer system, the set of instructions may be stored as a computer program product in another computer memory, for example, in disk drive 820 (which may include a removable memory such as an optical disk or floppy disk for eventual use in the disk drive 820). The computer program product can also be stored at another computer and transmitted when desired to the user's work station by a network or by an external network such as the Internet. One skilled in the art will appreciate that the physical storage of the sets of instructions physically changes the medium upon which it is stored so that the medium carries computer readable information. The change may be electrical, magnetic, chemical, or some other physical change. While it is convenient to describe the invention in terms of instructions, symbols, characters, or the like, the reader should remember that all of these and similar terms should be associated with the appropriate physical elements.

In sum, the present invention provides an automated tool that extracts a plurality of datapath bus nets from a working netlist to create an Index Table. The tool reads the datapath nets (possibly thousands) from the working netlist into a tabular form called the Index Table. The Index Table is in a high-level form representation similar to the original VHDL design source, so that the logic designer can easily read it and change it with a text editor. The logic designer works with and modifies the Index Table in a logical fashion to indicate where the net connections must be changed. The tool then automatically reads the edited Index Table and automatically generates Engineering Change Order language based on text re-indexing in the Index Table. The ECO language is suitable for processing by an EDA tool, such as ChipBench, to make the required changes in the netlist.

While the invention has been shown and described with reference to particular embodiments thereof, it will be understood by those skilled in the art that the foregoing and other changes in form and detail may be made therein without departing from the spirit and scope of the invention.

We claim:

1. A tool that automatically formats Engineering Change Order language to specify required design changes in a microchip design, comprising:
   an import component that accepts a working netlist;
   a first automated portion that generates an index table;
   a text editor that modifies said index table to generate a modified index table; and
   a second automated portion that receives said modified index table and generates ECO language.

2. The tool of claim 1 wherein said first automated portion further comprises:
   a bus extraction component that extracts one or more buses from said working netlist; and
   an index creation component that tabulates said extracted one or more buses into said index table.

3. The tool of claim 1 wherein said second automated portion reconfigures said modified index table into an ECO language format, wherein said modified index table embodies a design change.

4. The tool of claim 1 wherein said one or more buses are specified by one or more user-supplied parameters.

5. A design system that automatically formats Engineering Change Order language to specify required design changes in a microchip design, comprising:

an import means for accepting a working netlist;

a first automated means for generating an index table;

a text editor means for modifying said index table to generate a modified index table that embodies a design change; and an ECO generation means for reconfiguring said modified index table into an ECO language format.

6. The system of claim 5 wherein said first automated means further comprises:

a bus extraction means for extracting one or more buses from said working netlist; and an index creation means for tabulating said extracted one or more buses into an index table.

7. The system of claim 5 wherein said one or more buses are specified by one or more user-supplied parameters.

8. The system of claim 5 further comprises an automated synthesis means for generating said working netlist.

9. The system of claim 5 further comprises an automated physical design means for accepting said ECO language format and implementing said design change.

10. A method that automatically formats Engineering Change Order language to specify required design changes in a microchip design, comprising:

accepting a working netlist;

extracting one or more buses from said working netlist;

tabulating said extracted one or more buses into an index table;

modifying said index table to generate a modified index table that embodies a design change; and reconfiguring said modified index table into an ECO language format.

11. The method of claim 10 wherein said one or more buses are specified by one or more user-supplied parameters.

12. The method of claim 10 further comprises writing said ECO language format to an ECO file.

13. The method of claim 12 further comprises:

forwarding said ECO file to an automated physical design tool.

14. A method to manufacture a tool that automatically formats Engineering Change Order language to specify required design changes in a microchip design, comprising:

providing an import component that accepts a working netlist;

providing a bus extraction component that extracts one or more buses from said working netlist;

providing an index creation component that tabulates said extracted one or more buses into an index table;

providing a text editor that modifies said index table to generate a modified index table that embodies a design change; and providing an ECO generation component that reconfigures said modified index table into an ECO language format.

15. The method of claim 14 wherein said one or more buses are specified by one or more user-supplied parameters.

16. A program storage device readable by a machine, tangibly embodying a program of instructions executable by the machine to perform method steps that automatically formats Engineering Change Order language to specify required design changes in a microchip design, comprising:

accepting a working netlist;

extracting one or more buses from said working netlist;

tabulating said extracted one or more buses into an index table, wherein said index table is subsequently modified by a user to create a modified index table; and reconfiguring said modified index table into an ECO language format.

17. The program storage device of claim 16 wherein said one or more buses are specified by one or more user-supplied parameters.

18. The program storage device of claim 16 further tangibly embodies the step of:

writing said ECO language format to an ECO file.

19. The program storage device of claim 18 further tangibly embodies the step of:

forwarding said ECO file to an automated physical design tool.

* * * * *